(12) United States Patent
Niu

(10) Patent No.: US 8,395,405 B2
(45) Date of Patent: Mar. 12, 2013

(54) PROBE

(75) Inventor: Hsiao-Yuan Niu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 262 days.

(21) Appl. No.: 12/844,027

(22) Filed: Jul. 27, 2010

(65) Prior Publication Data

US 2011/0234250 A1 Sep. 29, 2011

(30) Foreign Application Priority Data

Mar. 29, 2010 (TW) .............................. 99109288 A

(51) Int. Cl.
*G01R 31/20* (2006.01)

(52) U.S. Cl. .................................................. 324/754.01

(58) Field of Classification Search .. 324/754.01–754.1, 324/755.01–755.1, 762.01–762.1; 257/48; 438/14–18

See application file for complete search history.

(56) References Cited

U.S. PATENT DOCUMENTS 4,105,970 A * 8/1978 Katz ......................... 324/755.05
6,737,878 B2 * 5/2004 Kagami .................... 324/755.01

* cited by examiner

*Primary Examiner* — Tung X Nguyen
(74) *Attorney, Agent, or Firm* — Altis Law Group, Inc.

(57) ABSTRACT

A probe for testing electronic properties of a circuit board by contacting with a weld bead on the circuit board is provided. The probe includes a main body. The main body includes an end surface, a receiving portion defined on the center of the end surface, and four positioning slots communicating with the receiving portion.

15 Claims, 4 Drawing Sheets

PROBE

BACKGROUND

1. Technical Field

The present disclosure generally relates to testing devices and, particularly, to a probe for testing a printed circuit board.

2. Description of Related Art

Developments in electronic technology have brought increases in the number of components arranged on the printed circuit boards. A printed circuit board having components thereon requires quality testing of electronic properties before release. In a commonly used testing method, a plurality of welding portions is formed on the conductive wires of the printed circuit board. However, each welding portion is wider than the conductive wire, whereby signal transmission of the conductive wires and, correspondingly, the testing precision may be compromised.

In another testing method, a weld bead is applied on the conductive wire, and then contacted with a probe. However, the probe often has a flattened surface or a plurality of protrusions with tips. The contact area between the probe and the weld bead may be relatively small, because the weld bead is substantially spherical, which decreases the testing precision. Furthermore, the tips of the probe may cause damage or break the weld bead or the conductive wire easily, which also decreases the testing precision.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
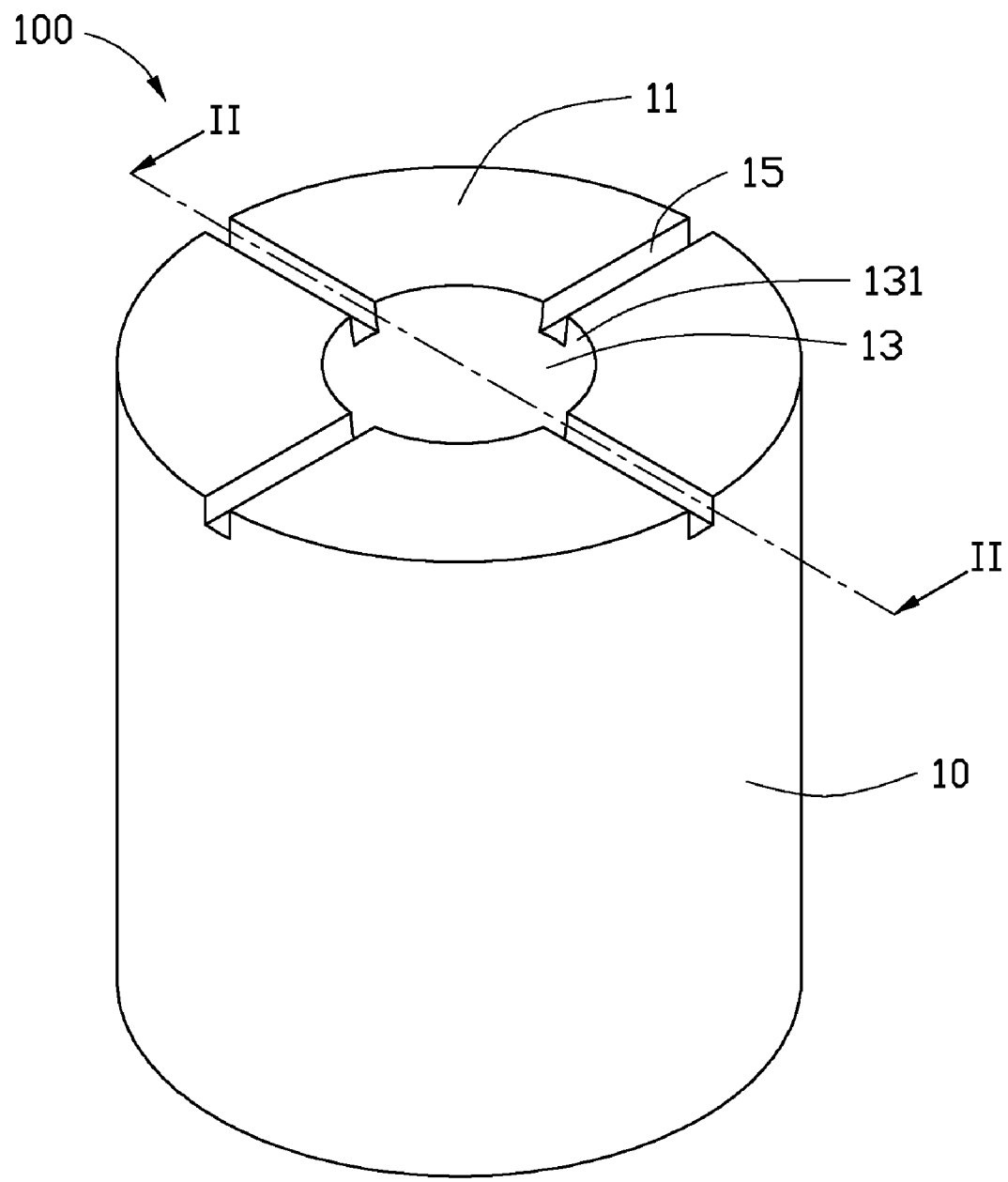
FIG. 1 is an assembled, isometric view of one embodiment of a probe as disclosed, the probe including a main body.
Figure 3:
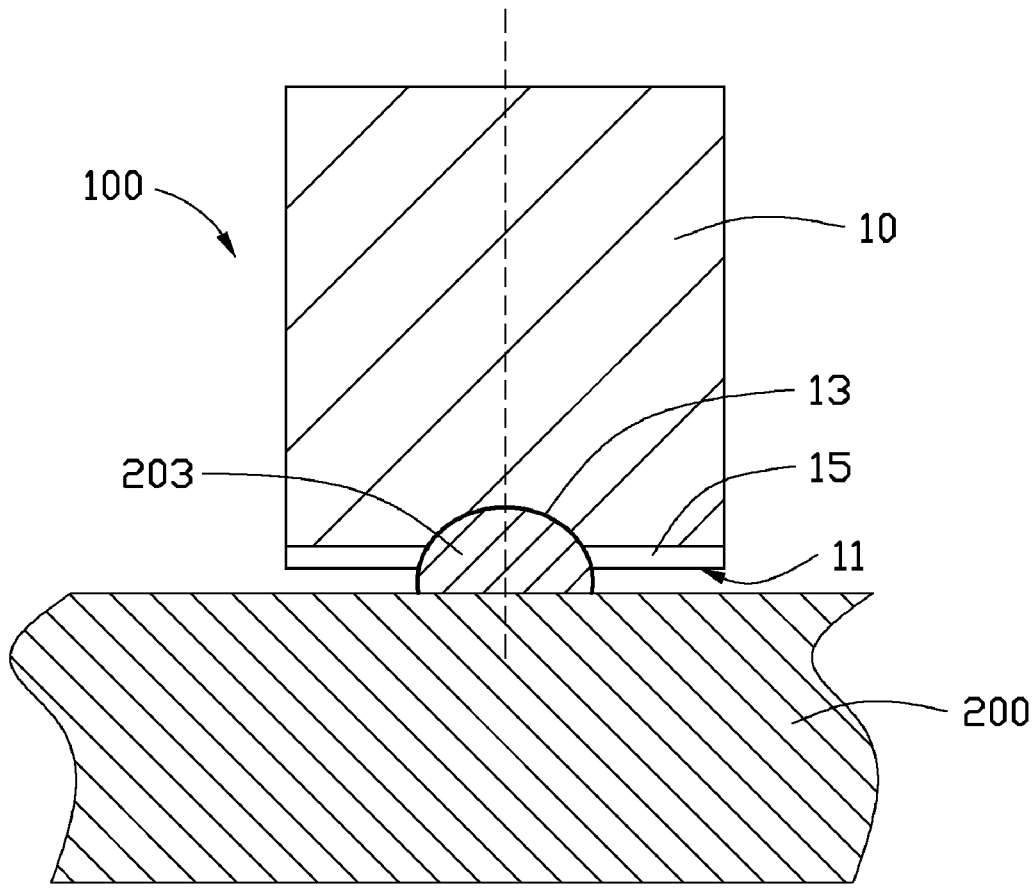
FIG. 3 shows the probe of FIG. 1 contacting a weld bead during testing on a circuit board.

Referring to FIGS. 1 and 3, one embodiment of a probe 100 is used to test one or more electronic properties of a circuit board 200 by contacting with a weld bead 203 on the circuit board 200. The probe 100 includes a main body 10.

Figure 2:
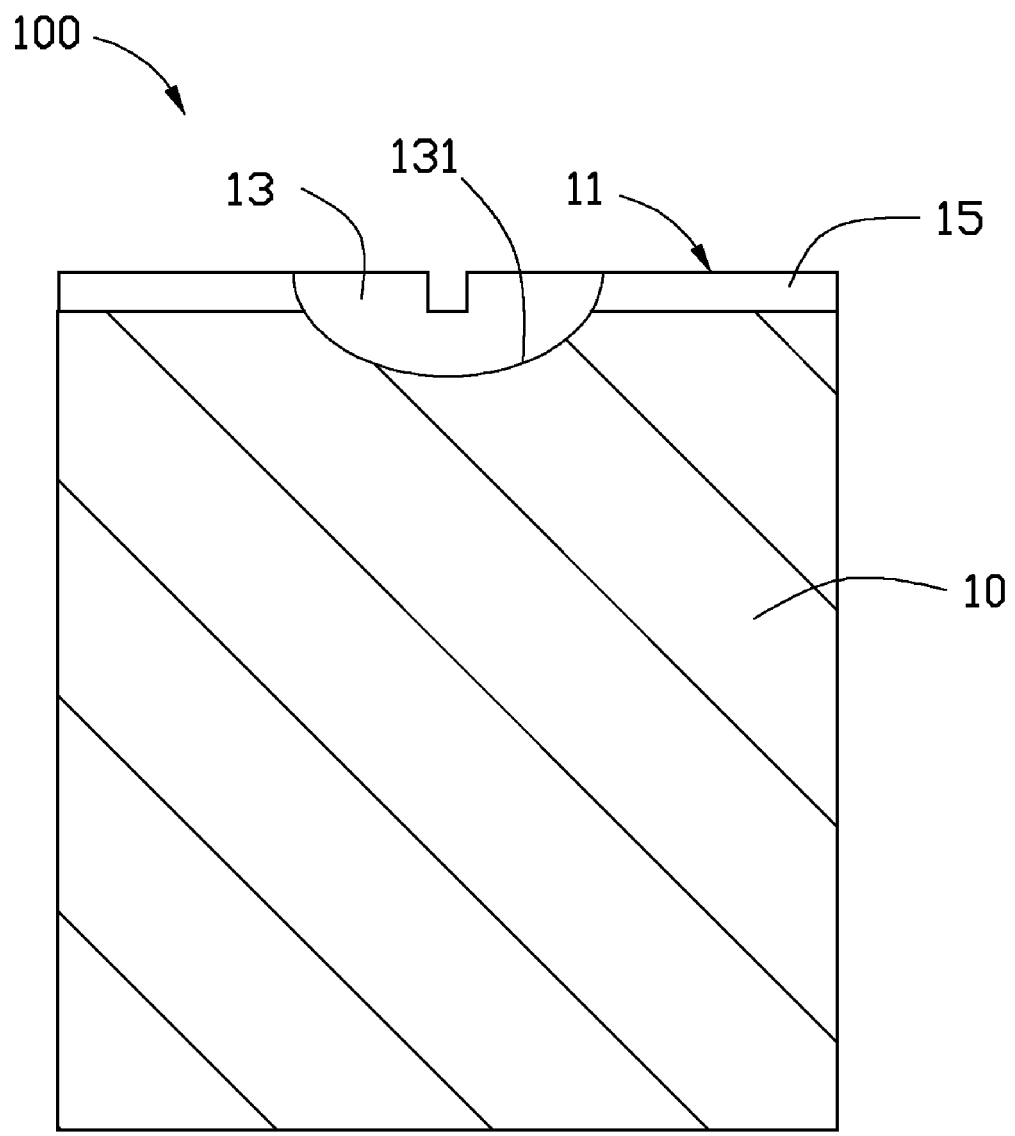
FIG. 2 is a cross-sectional view of the probe of FIG. 1 taken along line II-II.

Referring to FIGS. 1 and 2, the main body 10 is substantially cylindrical in shape, and includes an end surface 11, a receiving portion 13, and four positioning slots 15. The receiving portion 13 has a shape substantially corresponding to that of the weld bead 203. In one embodiment, the receiving portion 12 is substantially an elliptical groove defined in the center of the end surface 11. The receiving portion 13 has an inner wall 131. Each positioning slot 15 is defined in the end surface 11 and communicates with the receiving portion 13. Every two neighboring positioning slots 15 are perpendicular to each other, and the positioning slots 15 which are opposite are arranged in a line, so that the four positioning slots 15 cooperatively form a crisscross configuration.

Referring to FIG. 3, the weld bead 203 formed on a conductive wire (not shown) of the circuit board 200 is a substantially elliptical protrusion. Height of the weld bead 203 perpendicular to the circuit board 200 exceeds the depth of the receiving portion 13, so that when the receiving portion 13 contacts the weld bead 203, the end surface 11 is at a clearance apart from the surface of the circuit board 200.

Referring to FIGS. 1 through 3, when the probe 100 is used to test one or more electronic properties of the circuit board 200, the end surface 11 of the probe 100 faces the surface of the circuit board 200, and the weld bead 203 is received in the receiving portion 13 of the probe 100. The peripheral surface of the weld bead 203 fits precisely, tightly, or firmly with the inner wall 131 of the receiving portion 13, since the shape of the receiving portion 13 is similar to that of the weld bead 203. Therefore, the probe 100 can contact the bead 203 more stably, thereby providing a more precise testing result. In addition, the receiving portion 13 can protect the weld bead 203 from breaking.

During testing, the weld bead 203 is partially received in the receiving portion 13 of the probe 100, because the depth of the receiving portion 13 is less than the height of the weld bead 203. Therefore, a clearance is formed between the end surface 11 of the probe 100 and the surface of the circuit board 200, which can prevent the probe 100 from contacting other components (not shown) disposed on the circuit board 200, which are accordingly, safe from accidental damage.

Before testing, the four positioning slots 15 of the main body 10 arranged in a crisscross configuration can be used to position the probe 100. Since the weld bead 203 is located on the conductive wire of the circuit board 200, and the receiving portion 13 is defined in the center of the end surface 11, when two intervallic positioning slots 15 are above and aligned with the conductive wire underneath, another two intervallic positioning slots 15 are perpendicular to the conductive wire and are located at the opposite sides of the weld bead 203, thereby ensuring that the receiving portion 13 faces the weld bead 203, at which time, the probe 100 can be moved to contact the bead 203 in a more exact manner. Even if the receiving portion 13 is not configured opposite to the bead 203 exactly or correctly, the bead 203 however may be facing one of the positioning slots 15, and the positioning slot 15 can guide the bead 203 so as to be received in the receiving portion 13.

Figure 4:
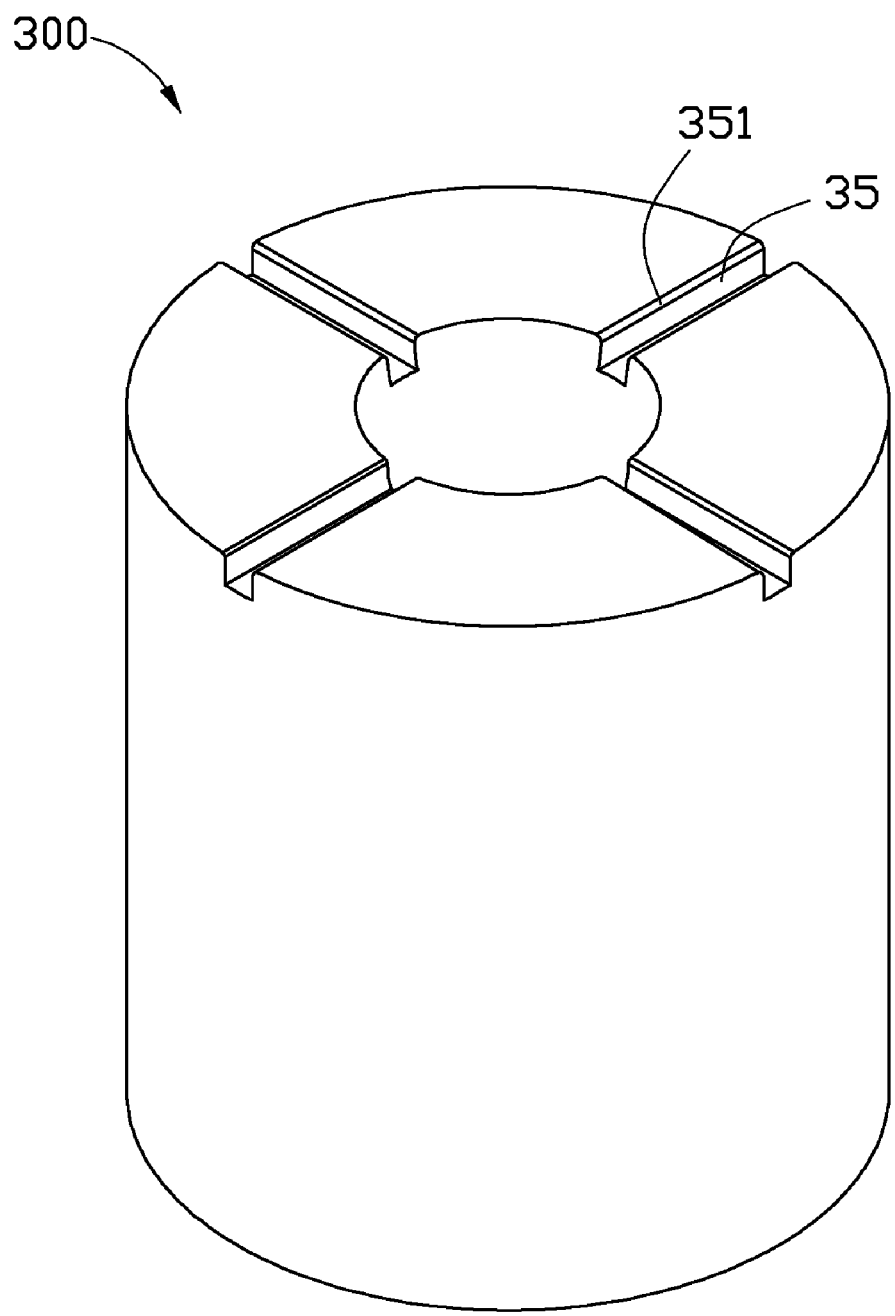
FIG. 4 is an assembled, isometric view of another one embodiment of a probe as disclosed.

Referring to FIG. 4, another embodiment of a probe 300 is shown. Each positioning slot 35 of the probe 300 includes two arcuate edges 351, which can help protect the weld bead 203 more effectively during testing.

Alternatively, one, two, or any other number of positioning slots 15 may be provided, which can also help position the probe 100. For example, the total number of the positioning slots 15 may be two, which are arranged perpendicularly.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A probe for testing a weld bead on a circuit board, the probe comprising:
a main body comprising:
a flat end surface;

a receiving portion defined in a center of the flat end surface for receiving at least a part of the weld bead, wherein the receiving portion comprises an inner wall capable of fitting tightly with the weld bead; and four positioning slots defined in the flat end surface, the four positioning slots surrounding and communicating with the receiving portion, wherein the four positioning slots are arranged in a crisscross configuration such that when the weld bead contacts the flat end surface but is offset from the receiving portion, at least one of the positioning slots facilitates guiding of the weld bead toward the receiving portion.

2. The probe of claim 1, wherein every two neighboring positioning slots are perpendicular to each other.

3. The probe of claim 1, wherein each of the four positioning slots comprises at least one arcuate edge along a length thereof where the positioning slot adjoins the flat end surface.

4. The probe of claim 1, wherein the height of the receiving portion along the axis of the main body is shorter than the height of the weld bead perpendicular to the surface of the circuit board.

5. The probe of claim 4, wherein the receiving portion is a substantially semi-elliptical groove in cross-section for fitting the weld bead which is a substantially semi-elliptical protrusion in cross-section.

6. The probe of claim 1, wherein the main body is substantially cylindrical.

7. The probe of claim 1, wherein each of the positioning slots has a uniform transverse width and a uniform depth.

8. The probe of claim 7, wherein each of the positioning slots comprises a pair of arcuate edges along a length thereof where the positioning slot adjoins the flat end surface, the arcuate edges configured for facilitating guiding the weld bead toward the receiving portion when the weld bead contacts the flat end surface at the positioning slot but is offset from the receiving portion.

9. The probe of claim 8, wherein when the at least a part of the weld bead is received in the receiving portion, the inner wall of the receiving portion fits tightly with the weld bead.

10. The probe of claim 9, wherein when the at least a part of the weld bead is received in the receiving portion, the weld bead is centered on a central axis of the probe.

11. A probe for testing a weld bead on a circuit board, the probe comprising:
a main body comprising:
a flat end surface;
a receiving portion defined in a center of the flat end surface for receiving at least a part of the weld bead, wherein the receiving portion has a shape substantially corresponding to that of the weld bead, and thus the receiving portion is capable of fitting tightly with the weld bead; and four positioning slots defined in the flat end surface, the four positioning slots surrounding and communicating with the receiving portion, wherein the positioning slots are arranged in a crisscross configuration such that when the weld bead contacts the flat end surface but is offset from the receiving portion, at least one of the positioning slots facilitates guiding of the weld bead toward the receiving portion.

12. The probe of claim 11, wherein every two neighboring positioning slots are perpendicular to one another.

13. The probe of claim 11, wherein each of the four positioning slots comprises at least one arcuate edge along a length thereof where the positioning slot adjoins the flat end surface.

14. The probe of claim 11, wherein the height of the receiving portion along the axis of the main body is shorter than the height of the weld bead perpendicular to the surface of the circuit board.

15. A probe for testing a weld bead on a circuit board, the probe comprising:
a main body comprising:
a flat end surface;
a receiving portion defined in a center of the flat end surface for receiving at least a part of the weld bead, wherein the receiving portion has a shape substantially corresponding to that of the weld bead, and thus the receiving portion is capable of fitting tightly with the weld bead; and four guiding slots defined in the flat end surface, the four guiding slots surrounding and communicating with the receiving portion, wherein the guiding slots are arranged in a crisscross configuration and are equally angularly spaced from each other such that when the weld bead contacts the flat end surface but is offset from the receiving portion, at least one of the guiding slots facilitates guiding of the weld bead toward the receiving portion.

* * * * *